(12) United States Patent
Lee et al.

(10) Patent No.: US 11,398,584 B2
(45) Date of Patent: Jul. 26, 2022

(54) ULTRAVIOLET LIGHT-EMITTING ELEMENT

(71) Applicants: SBK MATERIALS, Gwangju (KR); INDUSTRY FOUNDATION OF CHONNAM NATIONAL UNIVERSITY, Gwangju (KR)

(72) Inventors: June Key Lee, Gwangju (KR); Joon Mo Park, Gwangju (KR); Han Sung Lee, Hwaseong-si Gyeonggi-do (KR); Nae Sung Lee, Seoul (KR)

(73) Assignees: INDUSTRY FOUNDATION OF CHONNAM NATIONAL UNIVERSITY; INDUSTRY ACADEMY COOPERATION FOUNDATION OF SEJONG UNIVERSITY; Han-Sung Lee

( * ) Notice: Subject to any disclaimer, the term of this patent is extended or adjusted under 35 U.S.C. 154(b) by 172 days.

(21) Appl. No.: 16/968,562

(22) PCT Filed: Jan. 30, 2019

(86) PCT No.: PCT/KR2019/001249
§ 371 (c)(1),
(2) Date: Aug. 7, 2020

(87) PCT Pub. No.: WO2019/168273
PCT Pub. Date: Sep. 6, 2019

(65) Prior Publication Data
US 2020/0395508 A1 Dec. 17, 2020

(30) Foreign Application Priority Data
Feb. 28, 2018 (KR) .................... 10-2018-0024790

(51) Int. Cl.
*H01L 33/38* (2010.01)
*H01L 33/06* (2010.01)
*H01L 33/52* (2010.01)

(52) U.S. Cl.
CPC .............. *H01L 33/38* (2013.01); *H01L 33/06* (2013.01); *H01L 33/52* (2013.01)

(58) Field of Classification Search
CPC .......... H01L 33/38; H01L 33/06; H01L 33/52
See application file for complete search history.

(56) References Cited

U.S. PATENT DOCUMENTS

2002/0036599 A1\* 3/2002 Nishimura .............. H01J 3/022
345/11
2006/0244360 A1\* 11/2006 Lee ......................... H01J 29/90
313/495

(Continued)

FOREIGN PATENT DOCUMENTS

JP 2006190541 A 7/2006
KR 20090000325 A 1/2009

(Continued)

*Primary Examiner* — Mark W Tornow
(74) *Attorney, Agent, or Firm* — Renaissance IP Law Group LLP

(57) ABSTRACT

Disclosed is an ultraviolet light-emitting element which uses an electron emission operation. The ultraviolet light-emitting element is sealed to maintain a high degree of vacuum. A emission substrate is prepared for the electron emission and an electron emitted from the emission substrate passes through a control substrate. The electron, which has passed through the control substrate, collides with a light-emitting substrate, from which formation of a p-type semiconductor has been excluded, and thus forms ultraviolet light.

16 Claims, 5 Drawing Sheets

(56) References Cited

U.S. PATENT DOCUMENTS

| | | | | |
|---|---|---|---|---|
| 2008/0291364 A1* | 11/2008 | Moon | ............... | G09G 3/22 |
| | | | | 362/296.07 |
| 2008/0309216 A1* | 12/2008 | Park | ............... | H01J 63/04 |
| | | | | 313/496 |
| 2009/0066881 A1* | 3/2009 | Park | ............... | H01J 29/94 |
| | | | | 313/496 |
| 2017/0125683 A1* | 5/2017 | Lee | ............... | H01L 33/0004 |

FOREIGN PATENT DOCUMENTS

| KR | 20100045597 A | 5/2010 |
|---|---|---|
| KR | 20160034829 A | 3/2016 |
| KR | 101690430 B1 | 12/2016 |

* cited by examiner

ULTRAVIOLET LIGHT-EMITTING ELEMENT

TECHNICAL FIELD

The present disclosure relates to an ultraviolet light-emitting element, and more particularly, to an ultraviolet light-emitting element using electron emission and vacuum packaging.

BACKGROUND ART

Ultraviolet light refers to light having a shorter wavelength than visible light and having various industrial uses such as curing and sterilizing. There are two main methods of forming ultraviolet light.

A first method uses mercury lamps. The mercury lamp mainly uses a mixture of mercury and indium and is applied in curing, sterilizing, and the like. In addition, the mercury lamp is also used for treating wastewater and activating a photocatalyst. Due to regulation of use of mercury, it is expected that application fields of the mercury lamp will be reduced or use of the mercury lamp will be restricted in future.

A second method uses lamps using light-emitting diodes. The light-emitting diode is an element that emits light through recombination between electrons and holes and is manufactured based on a metal organic chemical vapor deposition (MOCVD) process in order to form a single crystal. In order for electrons and holes to recombine, an n-type semiconductor for supplying electrons and a p-type semiconductor for supplying holes should essentially be used. In addition, a multi-quantum well structure is used to form light in a desired wavelength band. A multi-quantum well structure for forming light in an ultraviolet band uses AlGaN. The p-type semiconductor for supplying holes is formed by doping magnesium (Mg) into AlGaN. However, due to a low activation rate of the doped Mg, there are problems in that a concentration of a dopant is not sufficient and resistance of the p-type semiconductor is high. In order to solve the problems, technology is used in which a p-GaN is formed on a p-AlGaN layer and the formed p-GaN is used as a source of holes. Since the p-GaN has a relatively high dopant activation rate as compared with p-AlGaN, the p-GaN may serve as a source of holes. However, holes supplied from the p-GaN pass through the p-AlGaN having high resistance to generate heat, thereby causing a problem of reducing a lifespan of a light-emitting diode. In addition, ultraviolet light formed in the multi-quantum well structure is absorbed by the p-GaN having a relatively small bandgap, thereby resulting in a problem in that intensity of ultraviolet light emitted to the outside is very low.

Despite the above-described technical disadvantages, ultraviolet light sources using light-emitting diodes have been steadily developed. In the art on the filing date of the present application, ultraviolet (UV) light is divided into UV-A, UV-B and UV-C according to wavelengths. The UV-C has the shortest wavelength band, and the UV-A has a relatively long wavelength band.

In the case of the UV-A having a relatively long wavelength band, a light-emitting diode may be manufactured even in a state in which a leading role of an AlGaN single crystal is excluded, thereby obtaining relatively high light efficiency, reliability, and light output. That is, the UV-A light-emitting diode means an element which may be manufactured using a GaN single crystal without using the AlGaN single crystal. Meanwhile, an AlGaN layer is formed in a multi-quantum well structure according to a wavelength to be implemented, and aluminum (Al) is provided to have a relatively very low fraction.

On the other hand, in the case of UV-B or UV-C, when a light-emitting diode is manufactured using a MOCVD process, which is the conventional process of manufacturing light-emitting diodes, and using an AlGaN crystal structure, it is difficult to obtain sufficient light output, reliability, and light efficiency. A multi-quantum well structure suitable for a wavelength of light to be formed may be manufactured by adjusting a fraction of Al in an AlGaN layer. However, a p-AlGaN layer should be formed on the multi-quantum well structure, and Mg should be used as a dopant. As described above, in the p-AlGaN layer, activation of the dopant is not sufficient, and a problem of high resistance occurs. To solve the problems, a p-GaN layer is usually formed on the p-AlGaN layer, but may cause a problem of absorbing ultraviolet light due to a relatively low bandgap thereof.

As described above, technology for forming ultraviolet light using light-emitting diodes has many problems. Nevertheless, since the light-emitting diodes have various factors such as eco-friendliness and design ease as compared with mercury lamps, which are the conventional ultraviolet lamps, a demand for the light-emitting diodes is being steadily induced.

However, ultraviolet light-emitting diodes manufactured using the conventional manufacturing technology have problems such as low yield in addition to technical difficulties and disadvantages. Therefore, due to various causes, ultraviolet light sources using light-emitting diodes somewhat lack a capability to replace the conventional ultraviolet light sources represented by the mercury lamps.

DISCLOSURE

Technical Problem

The present inventive concept is directed to providing an ultraviolet light-emitting element capable of forming ultraviolet light having a desired wavelength using electron emission.

Technical Solution

According to an exemplary embodiment of the present inventive concept, an ultraviolet light-emitting element includes an electron supply unit which emits electrons due to a first voltage difference, a light-emitting unit which forms ultraviolet light due to the electrons emitted from the electron supply unit being accelerated and colliding with a multi-quantum well structure due to a second voltage difference, and a sealing unit which seals a space in which the electrons are generated and a space in which the electrons are accelerated, in a vacuum state.

According to another exemplary embodiment of the present inventive concept, an ultraviolet light-emitting element includes an electron emission unit which includes an emission electrode configured to receive an emission voltage and an emission substrate configured to receive the emission voltage to emit electrons and in which a first separation space is formed between the emission electrode and the emission substrate, an electron control unit which includes a control electrode configured to receive a control voltage and a control substrate formed below the control electrode to form a second separation space with respect to the emission substrate, an inner spacer which is formed between the emission substrate and the control substrate and formed in a peripheral region, defines the second separation space, and is made of an insulating material, a light-emitting substrate which is spaced a separation distance from the control substrate to form a third separation space with respect to the control substrate and in which electrons emitted from the emission substrate collide therewith to form ultraviolet light, a light-emitting electrode which is formed on the light-emitting substrate and supplies a light-emitting voltage, a first spacer which seals side surfaces of the emission substrate, the inner spacer, and the control substrate and is formed between the emission electrode and the control electrode, and a second spacer which is formed between the control electrode and the light-emitting electrode and shields the third separation space.

Advantageous Effects

According to the present inventive concept, electrons are emitted from an emission substrate to a second separation space due to a first voltage difference. The emitted electrons pass through a control substrate and enter a light-emitting substrate due to a second voltage difference. The electrons entering the light-emitting substrate collide with an active layer to form electron-hole pairs and may form ultraviolet light through recombination. A wavelength of the formed ultraviolet light is determined according to a design of a well layer and a barrier layer of the active layer. Since the formation of a p-type semiconductor layer is excluded, a decrease in light efficiency does not occur. In addition, since intensity of the ultraviolet light is determined by the energy and energy density of the entering electrons, it is possible to output light having desired intensity.

DETAILED DESCRIPTION

Figure 1:
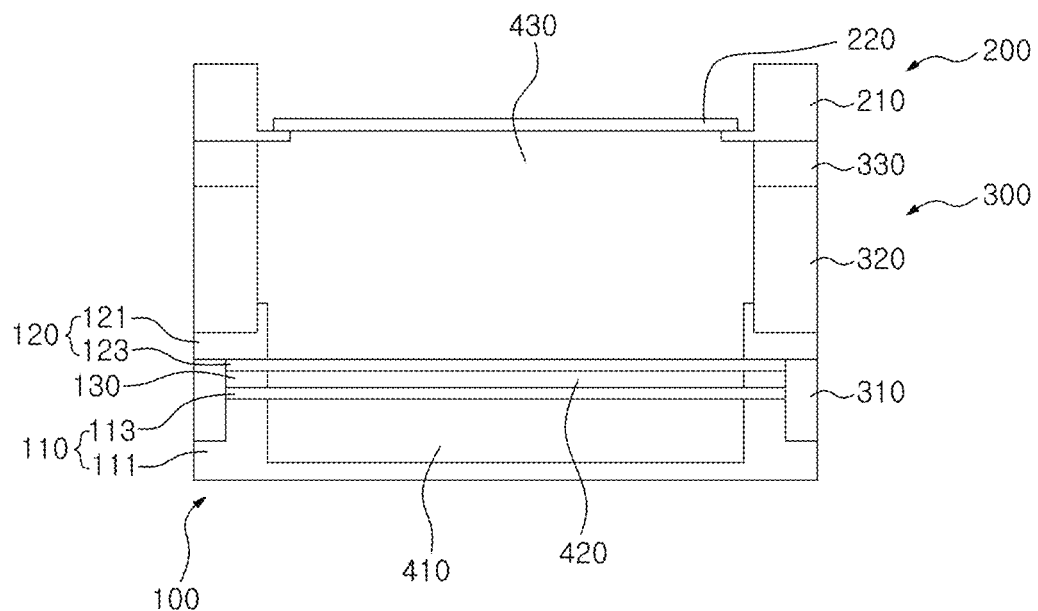
FIG. 1 is a cross-sectional view of an ultraviolet light-emitting element according to an exemplary embodiment of the present inventive concept.

While the present inventive concept is open to various modifications and alternative embodiments, specific embodiments thereof will be described and shown by way of example in the accompanying drawings. However, it should be understood that there is no intention to limit the present inventive concept to the particular embodiments disclosed, and, on the contrary, the present inventive concept is to cover all modifications, equivalents, and alternatives falling within the spirit and scope of the present inventive concept. In describing the drawings, like reference numerals are used for like elements.

Unless defined otherwise, all the terms (including technical and scientific terms) used herein have the same meaning as commonly understood by one of ordinary skill in the art to which the present inventive concept belongs. It will be further understood that the terms, such as those defined in commonly used dictionaries, should be interpreted as having meanings that are consistent with their meanings in the context of the relevant art and should not be interpreted in an idealized or overly formal sense unless expressly defined otherwise herein.

In the present inventive concept, an electron emission mechanism or a cathodoluminescence mechanism is performed without using an existing electroluminescent mechanism. The electroluminescent mechanism refers to a phenomenon in which, due to a voltage difference between voltages applied to a negative electrode and a positive electrode, electrons and holes are transferred and recombined to emit light. A representative element is a light-emitting diode.

The electron emission mechanism refers to an operation in which electrons are transferred due to a voltage difference between voltages applied to two electrodes, the transferred electrons collide with a light-emitting layer, and electrons and holes are generated due to the collision and recombined so as to emit light. Energy of the transferred electrons needs to be high enough that the electrons are transferred due to the applied voltage difference and collide with the light-emitting layer to emit light. In addition, even though the electrons are transferred at a high speed according to an electric field, there is a limitation in that a sufficient vacuum state should be achieved in a movement path or a movement space.

The present inventive concept is devised to solve such a problem and provides an ultraviolet light source element capable of maintaining a vacuum and performing an effective electron emission operation and a light-emitting operation.

Hereinafter, exemplary embodiments of the present inventive concept will be described in more detail with reference to the accompanying drawings.

Embodiments

FIG. 1 is a cross-sectional view of an ultraviolet light-emitting element according to an exemplary embodiment of the present inventive concept.

Referring to FIG. 1, the ultraviolet light-emitting element includes an electron supply unit 100, a light-emitting unit 200, and a sealing unit 300.

The electron supply unit 100 generates electrons for electron emission and controls energy or an amount of the generated electrons. The light-emitting unit 200 is a component with which an electron beam supplied from the electron supply unit 100 collides and in which a light-emitting operation is performed. In addition, the sealing unit 300 seals the ultraviolet light-emitting element and is disposed between the electron supply unit 100 and the light-emitting unit 200 to perform a sealing function.

First, the electron supply unit 100 includes an electron emission unit 110, an electron control unit 120, and an inner spacer 130.

The electron emission unit 110 performs an electron emission operation due to an applied voltage difference. In order to perform the above-described operation, the electron emission unit 110 includes an emission electrode 111 and an emission substrate 113. An emission voltage applied to the emission electrode 111 is transmitted to the emission substrate 113. A first voltage difference between the emission voltage transmitted to the emission substrate 113 and a control voltage applied from the electron control unit 120 determines an electron emission operation of the emission substrate 113.

In the present inventive concept, the emission voltage is applied to the emission electrode and transmitted to the emission substrate, and the control voltage is transmitted to a control substrate through a control electrode. In addition, a light-emitting voltage to be described below is transmitted to a light-emitting substrate through a light-emitting electrode. For convenience of description, since an electrode and a substrate are electrically connected, it will be described that a voltage applied to each electrode is applied to one substrate. For example, it will be described that the control voltage is applied to the control electrode and also equally applied to the control substrate.

The emission electrode 111 may be made of any material as long as the material has typical physical properties, such as corrosion resistance, as a metal material. In addition, the emission electrode 111 constitutes an outer portion of a bottom surface of the ultraviolet light-emitting element, and the emission substrate 113 is mounted on a protrusion of the upper part of the emission electrode 111.

A bottom surface of the emission substrate 113 is in contact with and electrically connected to the upper protrusion of the emission electrode 111. In particular, electron emission materials capable of emitting electrons are formed on a upper surface of the emission substrate 113. In addition, the emission substrate 113 has through-holes to connect a upper side space and a bottom side space of the emission substrate 113.

Since the emission substrate 113 is disposed on the protrusion, a first separation space 410 is formed between a lower surface of the emission electrode 111 and the emission substrate 113. A getter layer capable of absorbing various gases or particles is formed on the lower surface of the emission electrode 111 which defines the first separation space 410.

The electron control unit 120 is spaced a certain interval from the electron emission unit 110 by the inner spacer 130.

The electron control unit 120 is formed to be spaced a certain separation distance from the electron emission unit 110 and extracts or controls electrons emitted from the electron emission unit 110. In addition, the electron control unit 120 may form the first voltage difference with respect to the electron emission unit 110 to control the energy and amount of the emitted electrons. The inner spacer 130 is provided between the electron emission unit 110 and the electron control unit 120. Due to the inner spacer 130 having an insulating property, the electron emission unit 110 and the electron control unit 120 may not be short-circuited to each other, and application of an electric field is possible.

The electron control unit 120 includes a control electrode 121 and a control substrate 123.

The control electrode 121 may have various shapes and have the same outer shape as the emission electrode 111 thereunder. For example, when the emission electrode 111 has a circular shape, the control electrode 121 also has a circular shape. The control electrode 121 is formed on the control substrate 123, is formed along an upper periphery of the control substrate 123, and is in direct contact with an upper portion of the control substrate 123 to apply a control voltage applied from the outside to the control substrate 123.

The control substrate 123 receives the control voltage applied from the control electrode 121. Accordingly, the first voltage difference between the control voltage and the emission voltage is formed between the control substrate 123 and the emission substrate 113. The first voltage difference formed between the control substrate 123 and the emission substrate 113 determines whether the emission substrate 113 emits electrons and determines an emission amount of the electrons. In addition, the control substrate 123 has a plurality of through-holes in an entire surface of the substrate. That is, when the control substrate 123 has holes passing through upper and bottom surfaces thereof, due to the holes, electrons emitted from the emission substrate 113 may pass through the control substrate 123 and enter the light-emitting unit 200.

The inner spacer 130 is provided between the emission substrate 113 and the control substrate 123 and insulates the emission substrate 113 from the control substrate 123. Thus, a second separation space 420 having a certain separation distance is formed between the emission substrate 113 and the control substrate 123, and electron emission and electron control operations may be performed due to the first voltage difference between voltages applied to the two substrates.

The light-emitting unit 200 is formed above the electron supply unit 100. The light-emitting unit 200 is spaced a certain separation distance from the control substrate 123 of the electron supply unit 100 and forms a third separation space 430 with respect to the sealing unit 300 constituting a side surface of the ultraviolet light-emitting element. The light-emitting unit 200 includes a light-emitting electrode 210 and a light-emitting substrate 220.

The light-emitting electrode 210 is formed to have a shape which supports a peripheral portion of the light-emitting substrate 220. The light-emitting electrode 210 has a protrusion protruding toward a side surface of the light-emitting substrate 220, and the protrusion is bonded to the light-emitting substrate 220. The light-emitting electrode 210 and the light-emitting substrate 220 are electrically connected through conductive bonding.

It is preferable that a substrate for growing a light-emitting diode, such as a sapphire substrate, is used as the light-emitting substrate 220. In addition, the light-emitting substrate 220 includes a plurality of compound semiconductor layers formed through a typical film forming process. The formed compound semiconductor layers are disposed to face the third separation space 430. The light-emitting voltage applied to the light-emitting electrode 210 is supplied to the electrically connected light-emitting substrate 220. Electrons emitted from the emission substrate 113 due to the first voltage difference between the control voltage and the emission voltage pass through the control substrate 123, are accelerated due to the second voltage difference that is a voltage difference between the light-emitting voltage and the control voltage, and collide with the light-emitting substrate 220 so that kinetic energy of the electrons is converted into light energy. That is, the electrons are accelerated in the third separation space 430 and collide with the light-emitting substrate 220, and the light-emitting substrate 220 generates ultraviolet light by recombination between electrons and holes, which are generated by the collision of the electrons.

The sealing unit 300 includes a first spacer 310, a second spacer 320, and a buffer layer 330.

The first spacer 310 is provided to have a shape which covers a portion or an entirety of a side surface of the electron supply unit 100. For example, in FIG. 1, the first spacer 310 is disposed between the emission electrode 111 and the control electrode 121 and provided to have a shape which surrounds side surfaces of the emission substrate 113, the inner spacer 130, and the control substrate 123. It is preferable that a material of the first spacer 310 is ceramic which is capable of maintaining a structure which is stable against thermal deformation. For example, it is preferable that a material of the first spacer 310 includes $Al_2O_3$.

The emission electrode 111 made of a metal material and the first spacer 310 are bonded, and the control electrode 121 and the first spacer 310 are also bonded. In the bonding, a vacuum brazing bonding method is used, and a used filler and a processing temperature are as follows.

TABLE 1

| Type of filler | Processing temperature |
| --- | --- |
| Cu—Ag alloy filler | 750° C. to 1,000° C. |
| Ti alloy filler | 600° C. to 700° C. |
| Al ally filler | 550° C. to 600° C. |
| Zn—4Ag—2Al alloy filler | 300° C. to 450° C. |
| Sn—Ag—Ti alloy filler | 200° C. to 300° C. |
| Indium (In) bonding | Room temperature to 200° C. |

As described above, a metal alloy is used for vacuum bonding between a metal material and a ceramic material, and the first to third separation spaces 410 to 430 are maintained in a high vacuum state.

The second spacer 320 is disposed between the control electrode 121 and the buffer layer 330 and bonded to the control electrode 121 and the buffer layer 330. The third separation space 430 is defined through the bonding. In addition, when the buffer layer 330 is omitted, the second spacer 320 is disposed between the control electrode 121 and the light-emitting electrode 210 to define the third separation space 430 formed by the control substrate 123 and the light-emitting substrate 220. The bonding described with the first spacer 310 may be used to bond the second spacer 320 to the control electrode 121 or the buffer layer 330. In addition, a material of the second spacer 320 is insulating ceramic and preferably the same as that of the first spacer 310.

The buffer layer 330 is provided on the second spacer 320, and the buffer layer 330 is disposed between the second spacer 320 and the light-emitting electrode 210. The buffer layer 330 may be made of any metal material as long as the metal material has ductility or malleability. When the light-emitting electrode 210 is deformed by heat generated due to collision of electrons onto the light-emitting substrate 220, the buffer layer 330 is disposed to prevent the deformation of the light-emitting electrode 210 from causing deformation of the ultraviolet light-emitting element. In addition, the buffer layer 330 is firmly bonded to the second spacer 320 through metal-ceramic bonding. That is, the third separation space 430 is sealed through fusion bonding using a filler shown in Table 1 above.

The first separation space 410, the second separation space 420, and the third separation space 430 maintain a vacuum level ranging from about $10^{-6}$ torr to about $10^{-7}$ torr through fusion bonding of the first spacer 310, the second spacer 320, and the buffer layer 330. Therefore, electrons emitted from the emission substrate 113 may collide with the light-emitting substrate 220 to perform an ultraviolet light-emitting operation.

Figure 2:
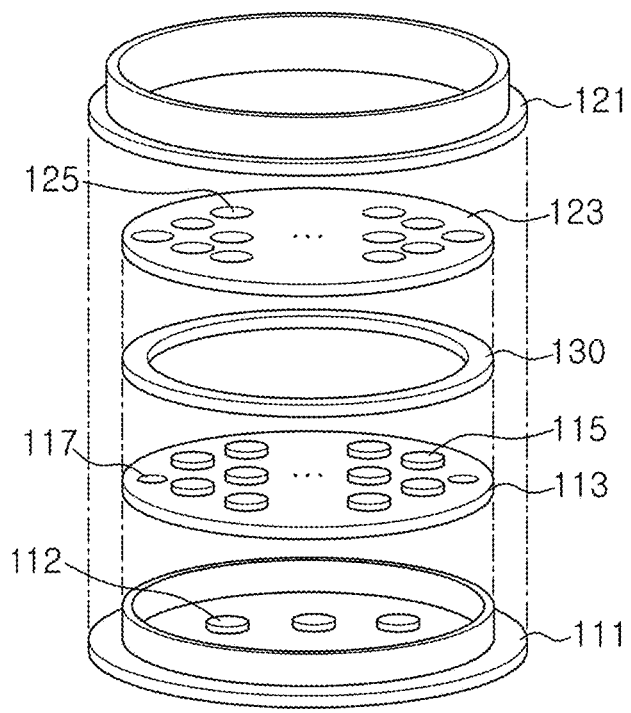
FIG. 2 is an exploded perspective view illustrating an electron supply unit of FIG. 1 according to the exemplary embodiment of the present inventive concept.

FIG. 2 is an exploded perspective view illustrating the electron supply unit of FIG. 1 according to the exemplary embodiment of the present inventive concept.

Referring to FIG. 2, the emission electrode 111 disposed on a lowermost layer constitutes a lower surface of the ultraviolet light-emitting element and includes the getter layer 112 on the lower surface. The getter layer 112 absorbs molecules or particles generated during an operation of the ultraviolet light-emitting element to allow a high vacuum state to be maintained.

The emission substrate 113 is provided on a surface of the protrusion of the emission electrode 111. The emission substrate 113 is made of a conductive metal material and includes electron emission layers 115 formed on a surface thereof. The electron emission layer 115 has a structure that emits electrons due to the applied first voltage difference and is provided in a patterned form. In addition, through-holes 117 are formed in a peripheral portion of the emission substrate 113. The through-hole 117 connects the first separation space and the second separation space. The first separation space is defined by bonding between the emission electrode 111 and the control substrate 113, and the second separation space is defined between the emission substrate 113 and the control substrate 123. Accordingly, particles or molecules generated in the second separation space may be absorbed by the getter layer 112 in the first separation space through the through-hole 117.

In addition, the through-holes 117 may be formed at various positions of the emission substrate 113.

The inner spacer 130 is provided on the emission electrode 111. The second separation space may be defined by the inner spacer 130 made of an insulating ceramic material, and the emission substrate 113 and the control substrate 123 may maintain a certain separation distance.

The inner spacer 130 has an approximate ring shape and is disposed between the emission substrate 113 and the control substrate 123 to maintain a separation distance between the two substrates 113 and 123 and to prevent a short circuit phenomenon in which the two substrates comes into direct contact with each other.

The control substrate 123 disposed on the inner spacer 130 has a plurality of control holes 125. In addition, the control holes 125 have the same pattern as the electron emission layers 115 of the emission substrate 113 formed thereunder. That is, the control holes 125, which have a shape of a pattern matching a pattern of the electron emission layers 115, are formed and pass through upper and bottom surfaces of the control substrate 123.

The control electrode 121 is formed on the control substrate 123. The control electrode 121 may be made of a conductive metal material, have an approximate ring shape, and be variously selected according to the shape of the control substrate 123 thereunder. However, the control electrode 121 may be selected to have various shapes as long as the control electrode 121 has a structure capable of achieving direct contact or electrical connection with the control substrate 123.

Figure 3:
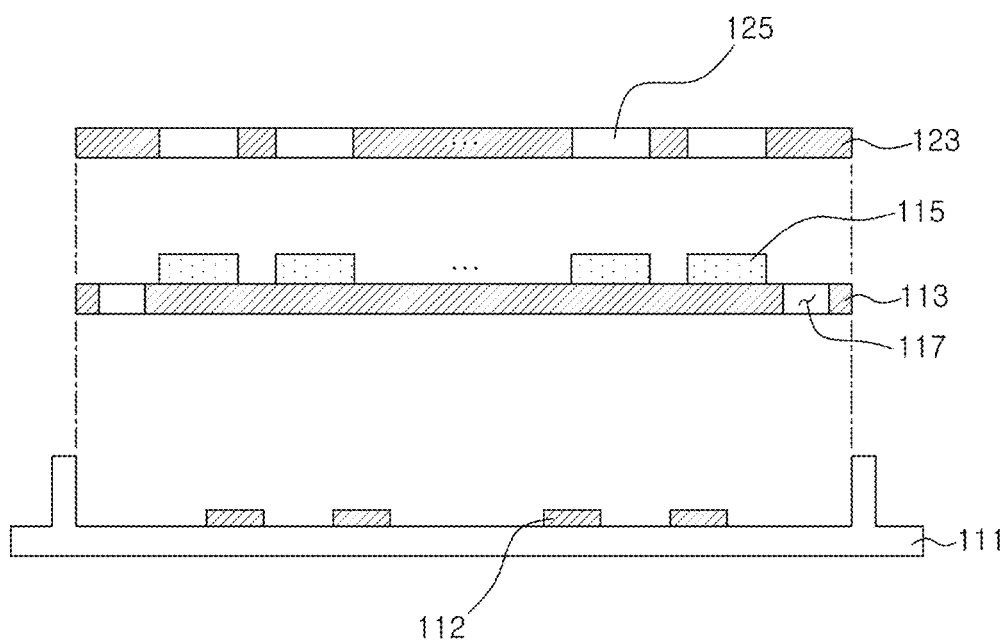
FIG. 3 is a schematic cross-sectional view illustrating an emission electrode, an emission substrate, and a control substrate of FIG. 1 according to the exemplary embodiment of the present inventive concept.

FIG. 3 is a schematic cross-sectional view illustrating the emission electrode, the emission substrate, and the control substrate of FIG. 1 according to the exemplary embodiment of the present inventive concept.

Referring to FIG. 3, the emission electrode 111 has the protrusion protruding upward and includes the getter layer 112 on a lower surface thereof. The protrusion is bonded to the emission substrate 113 and forms the first separation space.

The emission substrate 113 is made of a metal material, includes the electron emission layer 115 on the surface thereof and has the through-hole 117 in the peripheral portion of the surface thereof. Molecules or particles floating in the separation spaces are absorbed by the getter layer 112 through the through-holes 117. The electron emission layer 115 is formed in a patterned form on the surface.

A carbon nanotube (CNT) paste is prepared to form the electron emission layer 115. First, CNTs, ethyl cellulose, texanol, nickel (Ni), and $TiO_2$ are mixed. CNTs are a core material for electron emission, ethyl cellulose serves as a binder, and texanol is used as a binder aid. In addition, Ni particles are used to improve adhesion strength with the emission substrate below the electron emission layer 115, and $TiO_2$ particles are used as a kind of filler to prevent an electron emission effect from being lowered due to excessive adhesion strength being applied by the Ni particles.

The CNT paste is screen-printed on the emission substrate. The electron emission layers 115 having a regular pattern may be formed through screen printing. Thereafter, primary heat treatment is performed in the air at a temperature ranging from 300° C. to 450° C. Thus, an oxidation, decomposition, or volatilization operation of a polymer material may be performed, the Ni particles and $TiO_2$ particles may be disposed on the surface of the emission substrate, and the electron emission layers may be obtained in which CNTs are disposed in various forms between the particles. When a heat treatment temperature is less than 300° C., removal of the polymer material is not easy, and when the heat treatment temperature exceeds 450° C., the CNTs may be damaged.

In addition, after the primary heat treatment is performed, secondary heat treatment is performed. The secondary heat treatment is performed in a vacuum atmosphere (of about $10^{-6}$ torr) at a temperature ranging from 800° C. to 850° C. Through the secondary heat treatment, organic matter that may remain in the electron emission layers 115 is completely removed, and substrate adhesion strength of the electron emission layers 115 is improved. When a secondary heat treatment temperature is less than 800° C., a substrate oxidized by the primary heat treatment may not be completely reduced, and the adhesion strength of the electron emission layers 115 is weakened. In addition, when the secondary heat treatment temperature exceeds 850° C., the CNTs are damaged due to a reaction between the CNTs and mixed particles of Ni and the like, thereby degrading characteristics of the electron emission layers 115.

The control substrate 123 is fixedly disposed to be spaced a certain separation distance from the emission substrate 113. In addition, the control substrate 123 has a plurality of control holes 125. A size or width of each control hole 125 may be set to be greater than a size or width of the electron emission layer 115 corresponding thereto. Therefore, electrons emitted from the electron emission layer 115 may easily pass through the control hole 125. In addition, a shape and arrangement of the control holes 125 correspond to a shape and arrangement of the electron emission layers 115. That is, when viewed from above, it is preferable that the electron emission layers 115 are formed at positions at which the control holes 125 are formed.

As described above, the control holes 125 connect the second separation space and the third separation space. Therefore, the separation spaces may maintain the same vacuum level, and particles or molecules generated in the third separation space may be moved to and adsorbed by the getter layer 112.

Figure 4:
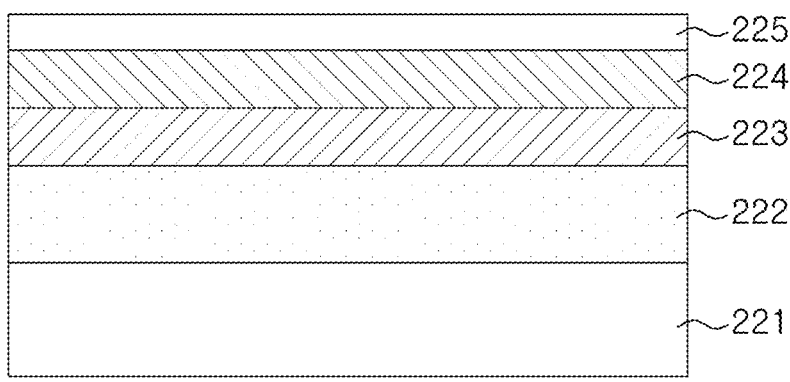
FIG. 4 is a cross-sectional view illustrating a light-emitting substrate of FIG. 1 according to the exemplary embodiment of the present inventive concept.

FIG. 4 is a cross-sectional view illustrating the light-emitting substrate of FIG. 1 according to the exemplary embodiment of the present inventive concept.

Referring to FIG. 4, the light-emitting substrate includes a growth substrate 221, a buffer layer 222, an n-type semiconductor layer 223, an active layer 224, and an electrode layer 225.

The growth substrate 221 may have any structure and shape as long as the growth substrate 221 is a typical substrate for growing a light-emitting diode, such as a sapphire substrate. The buffer layer 222 is formed on the growth substrate 221. The buffer layer 222 may have a structure made of MN and is a component that may be omitted in some exemplary embodiments.

The n-type semiconductor layer 223 is formed on the buffer layer 222. The n-type semiconductor layer 223 includes an AlGaN compound semiconductor. In addition, a dopant such as silicon (Si) for forming the n-type semiconductor layer 223 is used. The formed n-type semiconductor layer 223 blocks a phenomenon in which electrons introduced into the active layer 224 pass through or are diffused from the active layer 224. That is, the n-type semiconductor layer 223 having abundantly activated electrons exerts a repulsive force on electrons emitted from the emission substrate 113, thereby preventing secondary electrons generated by a collision between the active layer 224 and electrons from being introduced therein. Thus, a probability of recombination between electrons and holes is increased.

Subsequently, the active layer 224 is formed on the n-type semiconductor 223. The active layer 224 may have an AlGaN compound semiconductor structure and have a multi-quantum well structure in which barrier layers and well layers are alternately formed. In the active layer 224, a fraction of Al of the barrier layer is set to be higher than a fraction of Al of the well layer.

In addition, it is preferable that the fraction of Al of the barrier layer is the same as a fraction of Al of the AlGaN compound semiconductor in the n-type semiconductor layer 223.

The electrode layer 225 is formed on the active layer 224. The electrode layer 225 may include an Al metal. The electrode layer 225 transmits a light-emitting voltage applied through the light-emitting electrode 210 to the active layer 224, and the light-emitting voltage forms a second voltage difference with respect to a control voltage applied to the control substrate 123. In addition, it is preferable that the electrode layer 225 has a thickness of 30 nm or less. When the electrode layer 225 has a thickness exceeding 30 nm, the light-emitting voltage should be increased such that an electron beam sufficiently passes through the electrode layer 225.

In addition, the electrode layer 225 allows electrons passing through the control hole of the control substrate to pass therethrough and collide with the active layer 224. Ultraviolet light generated by the collision is reflected from the electrode layer 225. Thus, the ultraviolet light is emitted toward the growth substrate 221.

Electrons are emitted from the emission substrate due to the first voltage difference that is a voltage difference between the control voltage applied to the control substrate and the emission voltage applied to the emission substrate. The emitted electrons enter the third separation space through the control hole of the control substrate. Electrons in the third separation space are accelerated due to the second voltage difference that is a difference between the light-emitting voltage applied to the light-emitting substrate and the control voltage, pass through the electrode layer 225, and collide with the active layer 224. The well layer of the active layer 224 has a bandgap sufficient to form ultraviolet light. In addition, electron-hole pairs in the active layer 224 generated by a collision with electrons are confined within the well layer by the barrier layer and form ultraviolet light through recombination. For the above-described operation, the electrode layer 225 is in direct contact with the light-emitting electrode or electrically connected to the light-emitting electrode through metal fusion bonding.

In addition, the n-type semiconductor layer 223 has a bandgap higher than that of the well layer of the active layer 224 and prevents electron-hole pairs from being introduced therein. Accordingly, it is possible to minimize heat generation through scattering in addition to direct recombination.

In FIG. 4, the electrode layer 225 opposite to the growth substrate 221 is disposed in a direction of the third separation space 430 in FIG. 1. That is, the growth substrate 221 faces the outside of the ultraviolet light-emitting element, and the electrode layer 225 faces the inside of the ultraviolet light-emitting element. Therefore, in FIG. 1, it is preferable that the light-emitting electrode 210 is formed to have a structure that is electrically connected to the electrode layer 225.

Figure 5:
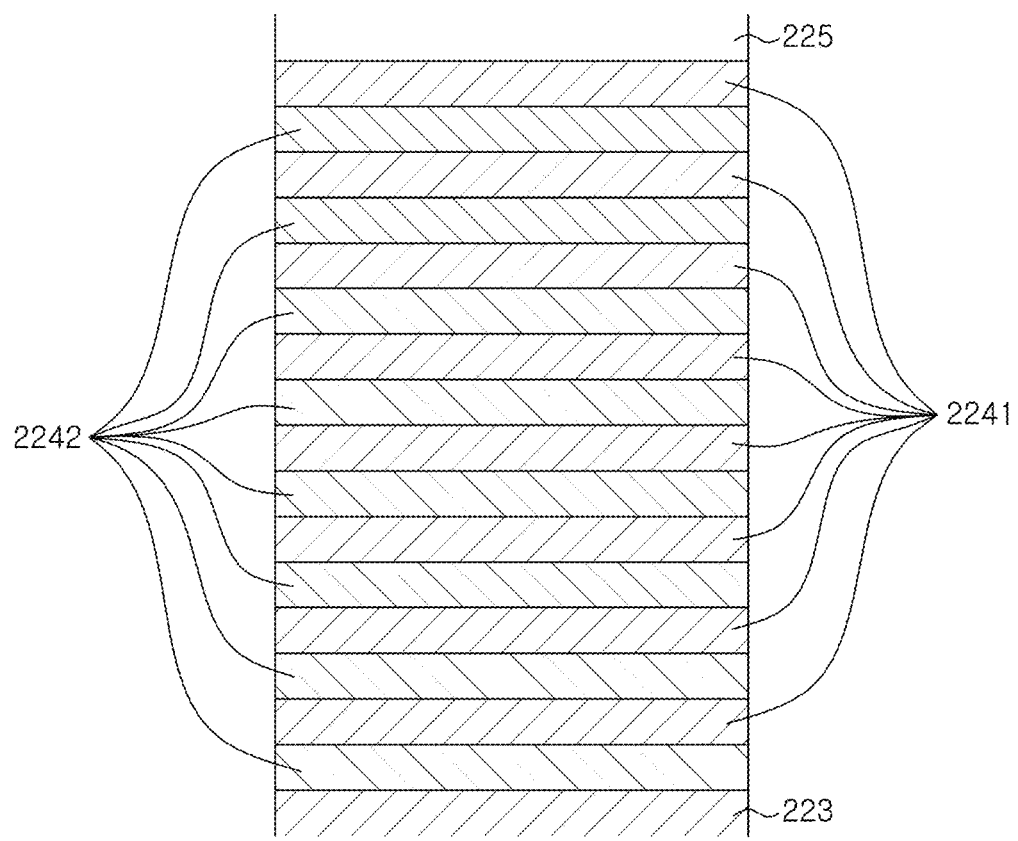
FIG. 5 is a cross-sectional view illustrating an active layer of FIG. 4 according to the exemplary embodiment of the present inventive concept.

FIG. 5 is a cross-sectional view illustrating the active layer of FIG. 4 according to the exemplary embodiment of the present inventive concept.

Referring to FIG. 5, the active layer 224 is formed on the n-type semiconductor layer 223, and the electrode layer 225 is formed on the active layer 224.

For example, the n-type semiconductor layer 223 has a thickness of about 500 nm and is made of n-type $Al_{0.7}Ga_{0.3}N$.

In addition, the active layer 224 formed on the n-type semiconductor layer 223 has a multi-quantum well structure which is a structure in which well layers 2242 and barrier layers 2241 are alternately formed. In addition, the well layer 2242 and the barrier layer 2241 constituting the active layer 224 are doped with Si to have an n-type conductivity type.

When the well layer 2242 and the barrier layer 2241 are designed, the barrier layer 2241 should have a bandgap higher than that of the well layer 2242, and the bandgap of the well layer 2242 should be formed such that the well layer 2242 has a fraction of Al suitable for a desired ultraviolet wavelength. For example, the well layer 2242 has an $Al_{0.54}Ga_{0.46}N$ structure, and the barrier layer 2241 has the same $Al_{0.7}Ga_{0.3}N$ structure as the n-type semiconductor layer 223. In addition, the well layer 2242 is set to have a thickness ranging from 8 nm to 16 nm. Preferably, the well layer 2242 is set to have a thickness ranging from 10 nm to 15 nm. The barrier layer 2241 is set to have a thickness ranging from 8 nm to 16 nm and preferably set to have a thickness ranging from 10 nm to 15 nm. A conventional well layer or barrier layer is set to have a thickness ranging from 1 nm to 2 nm. However, in the present inventive concept, the well layer 2242 or the barrier layer 2221 is set to substantially have a thickness of 10 nm or more.

In a typical light-emitting mechanism of a well layer and a barrier layer, recombination between electrons and holes confined within the well layer is induced by applying an electric field. Therefore, when the thickness of the barrier layer and the well layer exceeds 2 nm, recombination within the well layer is not smooth, and a phenomenon in which electrons and holes are transferred to adjacent well layers is lowered due to an increase in thickness of the barrier layer. However, in the present inventive concept, electrons and holes are not transferred using an electric field, and a mechanism is used in which accelerated electrons collide with a crystal structure in the well layer 2242 or barrier layer 2241 to form electron-hole pairs. Therefore, in the structure of the present inventive concept, when the thickness of the well layer 2242 or the barrier layer 2241 is less than 10 nm, due to the thickness of the thin well layer, a collision of electrons in the well layer is not sufficient, thereby resulting in a decrease in light efficiency. In addition, when the thickness exceeds 15 nm, electrons may not be transferred to other adjacent well layers, thereby resulting in a decrease in light efficiency.

In addition, it is preferable that 6 to 10 pairs of the well layer 2242 and the barrier layer 2241 having the above-described thickness are formed. When the pairs of the well layer 2242 and the barrier layer 2241 are less than 6 pairs, accelerated electrons may pass through the active layer 224. When the pairs of the well layer 2242 and the barrier layer 2241 exceed 10 pairs, electrons do not reach a well layer adjacent to the n-type semiconductor layer 223, and thus, there may be a well layer which may not participate in a light-emitting operation.

In addition, when the active layer 224 including the well layer 2242 is doped with n-type, due to abundantly generated electrons, a probability of recombination with holes generated through a collision of electrons is increased. Therefore, the well layer 2242 and the barrier layer 2241 may be doped with n-type, thereby improving light efficiency.

In addition, it is preferable that a fraction of Al in the n-type semiconductor layer 223 is the same as a fraction of Al in the barrier layer 2241. Accordingly, in FIG. 5, the fraction of Al in the n-type semiconductor layer 223 has a variable value according to the fraction of Al in the barrier layer 2241.

Figure 6:
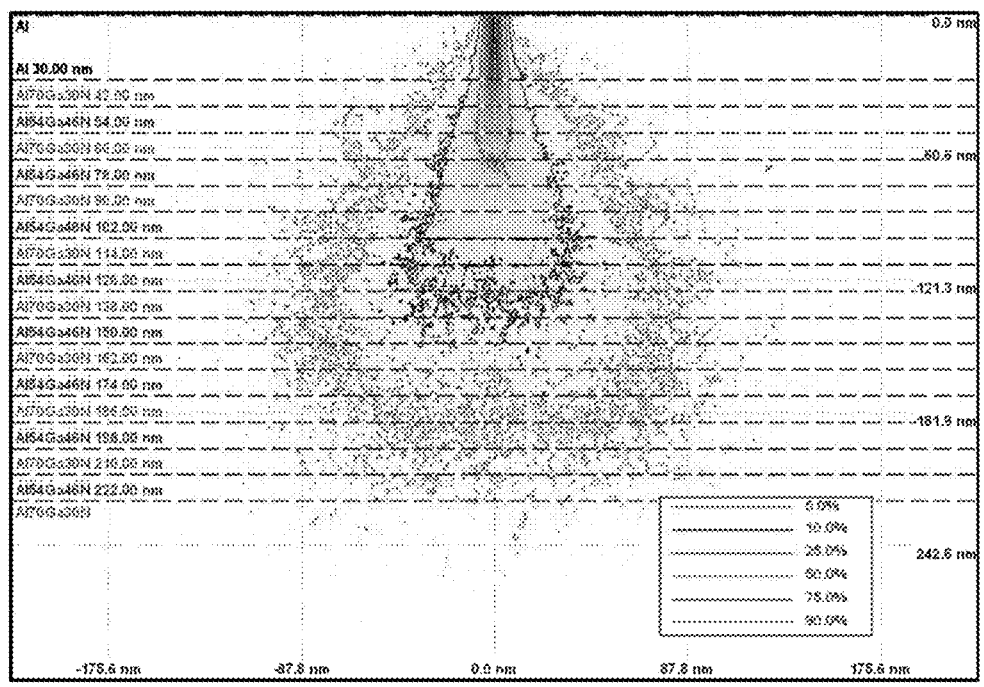
FIG. 6 shows simulation results of a light-emitting structure of FIG. 5 according to an exemplary embodiment of the present inventive concept.

FIG. 6 shows simulation results of a light-emitting structure of FIG. 5 according to the exemplary embodiment of the present inventive concept.

Referring to FIG. 6, a buffer layer is made of MN and has a thickness of 1,000 nm. In addition, an n-type semiconductor layer is made of n-type $Al_{0.7}Ga_{0.3}N$ doped with Si and set to have a thickness of 500 nm. In a multi-quantum well structure, each of barrier layers is made of $Al_{0.7}Ga_{0.3}N$ and is set to have a thickness of 12 nm, and each of well layers is made of $Al_{0.54}Ga_{0.46}N$ and set to have a thickness of 12 nm. 8 pairs of the barrier layer and the well layer are formed. In addition, an electrode layer is made of Al and set to have a thickness of 30 nm.

In FIG. 6, numerical values shown in a vertical direction indicate a depth from a surface of the electrode layer, and numerical values shown in a horizontal direction at the bottom of FIG. 6 indicate a plane distance from a point at which an electron beam is incident. In addition, numerical values expressed in % within a box indicate an energy density of electrons released by collision on the active layer 224.

A voltage of 5 kV is applied to electrons, and an electron beam is modeled as 10,000 electrons being irradiated to one point. Simulation results show that the electron beam maintains an energy density of 10% or more within a range in which a thickness of an active layer is up to 150 nm.

In addition, when the voltage applied to the electrons is increased, a thickness of the active layer having an energy density of 10% or more will be increased.

Furthermore, a diffusion distance of electrons or holes should also be considered when the active layer is designed. When the diffusion distance is set to range from 100 nm to 150 nm, a range of 100 nm to 300 nm appears to be an appropriate range of the thickness of the active layer. However, the thickness of the active layer may vary somewhat according to a magnitude of the voltage applied to the electrons.

An ultraviolet light-emitting element is manufactured using the above-described components. The ultraviolet light-emitting element is sealed in a vacuum atmosphere ranging from $10^{-6}$ torr to $10^{-7}$ torr. Through sealing, electrons may be emitted from an emission substrate, collide with a light-emitting substrate in the form of an electron beam, and form ultraviolet light. The ultraviolet light-emitting element forms a first separation space, a second separation space, and a third separation space. Molecules or particles generated during an ultraviolet light-emitting operation are removed through a getter layer provided in the first separation space to maintain a high vacuum. In the second separation space, electrons are emitted through a first voltage difference between voltages applied to a control substrate and an emission substrate. The emitted electrons are introduced into the third separation space through control holes formed in the control substrate. In the third separation space, electrons may be accelerated due to a second voltage difference between voltages applied to a light-emitting substrate and the control substrate, collide with an active layer of the light-emitting substrate, and form ultraviolet light.

Figure 7:
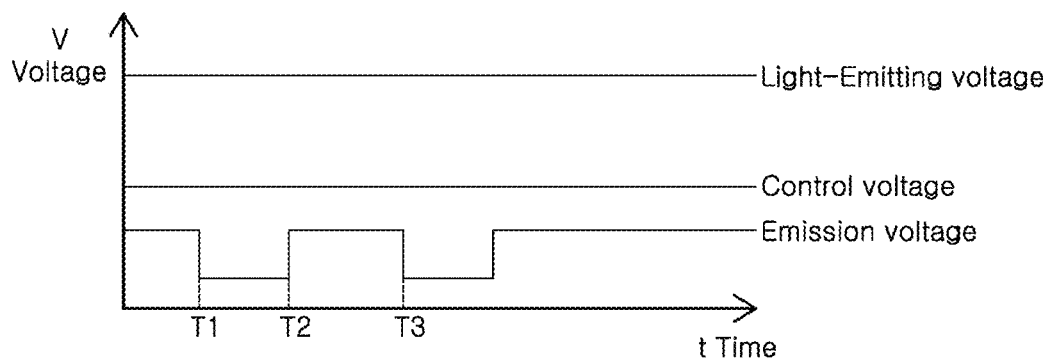
FIGS. 7 and 8 are timing graphs showing a method of operating the ultraviolet light-emitting element of FIG. 1 according to an exemplary embodiment of the present inventive concept.
Figure 8:
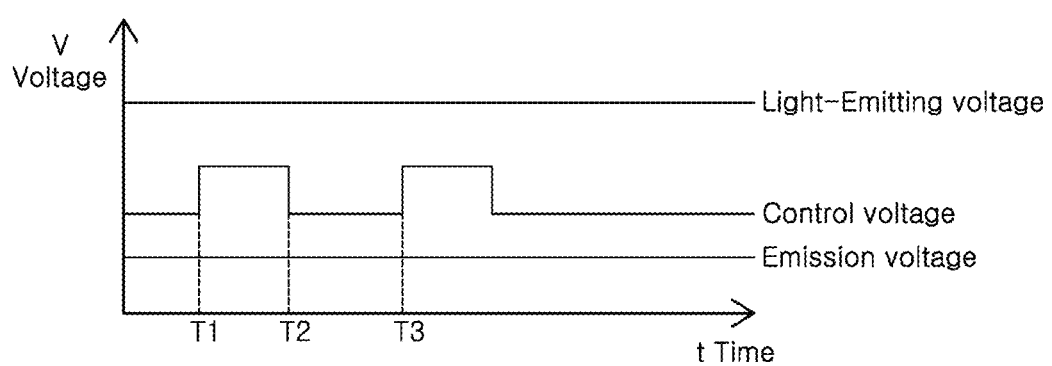

FIGS. 7 and 8 are timing graphs showing a method of operating the ultraviolet light-emitting element of FIG. 1 according to an exemplary embodiment of the present inventive concept.

Referring to FIG. 7, at a time T1, a control voltage is increased, and thus, electrons are emitted from an emission substrate due to a first voltage difference. The emitted electrons pass through control holes of a control substrate and are accelerated toward a light-emitting substrate to which a light-emitting voltage is applied. The above-described operation is performed until a time T2.

Next, when the control voltage is decreased at the time T2, the first voltage difference is decreased, and thus, electrons are not emitted from the emission substrate. Therefore, even when a second voltage difference, which is a difference between the light-emitting voltage and the control voltage, is high, a light-emitting operation is not performed.

Subsequently, when the control voltage is increased at a time T3, a light-emitting operation is performed as described above. In the above-described operation of FIG. 7, the light-emitting operation is performed by changing only the control voltage in a state in which an emission voltage and the light-emitting voltage are set to be constant.

Referring to FIG. 8, since a light-emitting voltage and a control voltage maintain a constant level, a second voltage difference is maintained to be constant. However, an emission voltage has a characteristic that is changed according to periods.

When a level of the emission voltage is decreased at a time T1, a first voltage difference is increased, and thus, electrons are emitted from the emission substrate. Accordingly, a light-emitting operation is performed in the light-emitting substrate due to the second voltage difference. The above-described operation is performed until a time T2.

Subsequently, when the level of the emission voltage is increased at the time T2, the first voltage difference is decreased, and thus, the emission of electrons from the emission substrate is stopped. Accordingly, the light-emitting operation in the light-emitting substrate is stopped.

That is, in FIGS. 7 and 8, the emission and emission stop of electrons from the emission substrate may be alternately performed. This is to prevent excessive heat generation and a reduction in energy efficiency in the light-emitting substrate that performs the light-emitting operation and to allow the light-emitting operation to be performed in a period in which electrons are emitted due to the first voltage difference. In addition, this is to allow light, which is delayed due to secondary electrons generated by electrons colliding with an active layer, to be formed in a period in which emission of electrons is stopped in a state in which the first voltage difference is low.

In the above-described operation, intensity of ultraviolet light generated in the light-emitting substrate may be adjusted by adjusting the second voltage difference. That is, it is possible to solve a limitation of the maximum output in a conventional ultraviolet light-emitting diode, and it is possible to easily form light in a desired short wavelength band (including UV-C) through a design of a multi-quantum well structure.

In addition, instead of an operation driven by setting at least one of an emission voltage, a control voltage, and a light-emitting voltage as an alternating current voltage, it may be possible to perform an operation by setting each voltage as a direct current.

The invention claimed is:

1. An ultraviolet light-emitting element comprising:
   an electron supply unit which emits electrons due to a first voltage difference;
   a light-emitting unit which forms ultraviolet light due to the electrons emitted from the electron supply unit being accelerated and colliding with a multi-quantum well structure due to a second voltage difference; and
   a sealing unit which seals a space in which the electrons are generated and a space in which the electrons are accelerated, in a vacuum state.

2. The ultraviolet light-emitting element of claim 1, wherein the electron supply unit includes:
   an electron emission unit which receives an emission voltage and emits the electrons due to the first voltage difference;
   an electron control unit which is formed on the electron emission unit, receives a control voltage, forms the first voltage difference which is a difference between the control voltage and the emission voltage, and controls an amount and energy of the emitted electrons; and
   an inner spacer which is disposed between the electron emission unit and the electron control unit, forms a separation distance between the electron emission unit and the electron control unit, and insulates the electron emission unit from the electron control unit.

3. The ultraviolet light-emitting element of claim 2, wherein the electron emission unit includes:
   an emission electrode which forms a lower surface of the ultraviolet light-emitting element and includes a getter layer formed on a bottom surface thereof; and
   an emission substrate which is formed on the emission electrode, includes electron emission layers patterned on a surface thereof to emit the electrons, and has through-holes through which molecules and particles are transferred to the getter layer,
   wherein the emission electrode and the emission substrate form a first separation space.

4. The ultraviolet light-emitting element of claim 3, wherein the electron control unit includes:
   a control substrate which is formed on the inner spacer and has control holes corresponding to a pattern of the electron emission layers; and a control electrode which is formed on the control substrate and applies the control voltage to the control substrate, wherein the control substrate and the emission substrate form a second separation space, and the electrons are emitted from the emission substrate to the second separation space due to the first voltage difference which is a difference between the control voltage and the emission voltage.

5. The ultraviolet light-emitting element of claim 4, wherein the control hole has a diameter that is greater than or to equal to a pattern size of the electron emission layer.

6. The ultraviolet light-emitting element of claim 4, wherein the electron emission layer includes carbon nanotubes (CNTs).

7. The ultraviolet light-emitting element of claim 2, wherein the light-emitting unit includes:

a light-emitting substrate which is formed on the electron control unit, with which the electrons emitted due to the first voltage difference collide, and which forms a third separation space with respect to the electron emission unit; and a light-emitting electrode which is formed on the light-emitting substrate and supplies a light-emitting voltage to the light-emitting substrate, wherein an acceleration operation of the electrons is performed in the third separation space due to the second voltage difference between the light-emitting voltage and the control voltage.

8. The ultraviolet light-emitting element of claim 7, wherein the light-emitting substrate includes:

a growth substrate;

an n-type semiconductor layer which is based on AlGaN and formed on the growth substrate;

an active layer which is formed on the n-type semiconductor layer and based on AlGaN, in which a well layer and a barrier layer are alternately stacked, and which is doped with an n-type; and an electrode layer which is formed on the active layer and is in electrical contact with the light-emitting electrode.

9. The ultraviolet light-emitting element of claim 8, wherein the well layer or the barrier layer has a thickness ranging from 10 nm to 15 nm.

10. The ultraviolet light-emitting element of claim 8, wherein the active layer has a thickness ranging from 100 nm to 300 nm.

11. The ultraviolet light-emitting element of claim 2, wherein the sealing unit includes:

a first spacer which shields a side surface of the electron supply unit; and a second spacer which is formed between the first spacer and the light-emitting unit and shields a space formed by the light-emitting unit and the electron emission unit.

12. The ultraviolet light-emitting element of claim 11, wherein the sealing unit further includes a buffer layer which is formed between the second spacer and the light-emitting unit and prevents deformation due to heat generated in the light-emitting unit.

13. An ultraviolet light-emitting element comprising:

an electron emission unit which includes an emission electrode configured to receive an emission voltage and an emission substrate configured to receive the emission voltage to emit electrons and in which a first separation space is formed between the emission electrode and the emission substrate;

an electron control unit which includes a control electrode configured to receive a control voltage and a control substrate formed below the control electrode to form a second separation space with respect to the emission substrate;

an inner spacer which is formed between the emission substrate and the control substrate and formed in a peripheral region, defines the second separation space, and is made of an insulating material;

a light-emitting substrate which is spaced a separation distance from the control substrate to form a third separation space with respect to the control substrate and in which electrons emitted from the emission substrate collide therewith to form ultraviolet light;

a light-emitting electrode which is formed on the light-emitting substrate and supplies a light-emitting voltage;

a first spacer which seals side surfaces of the emission substrate, the inner spacer, and the control substrate and is formed between the emission electrode and the control electrode; and a second spacer which is formed between the control electrode and the light-emitting electrode and shields the third separation space.

14. The ultraviolet light-emitting element of claim 13, further comprising a buffer layer which is formed between the second spacer and the light-emitting electrode and prevents deformation due to heat generated in the light-emitting substrate.

15. The ultraviolet light-emitting element of claim 13, wherein a getter layer is formed on a lower surface of the emission electrode forming the first separation space.

16. The ultraviolet light-emitting element of claim 13, wherein the emission substrate includes electron emission layers which include carbon nanotubes (CNTs) and are patterned, and the control substrate has control holes corresponding to the patterned electron emission layers.

* * * * *